United States Patent [19]
Soubeyrand et al.

[11] Patent Number: 5,090,985
[45] Date of Patent: Feb. 25, 1992

[54] METHOD FOR PREPARING VAPORIZED REACTANTS FOR CHEMICAL VAPOR DEPOSITION

[75] Inventors: Michel J. Soubeyrand, Perrysburg; Richard J. McCurdy, Toledo, both of Ohio

[73] Assignee: Libbey-Owens-Ford Co., Toledo, Ohio

[21] Appl. No.: 591,121

[22] Filed: Oct. 4, 1990

Related U.S. Application Data

[63] Continuation-in-part of Ser. No. 422,636, Oct. 17, 1989, abandoned.

[51] Int. Cl.[5] .......................................... C03C 17/245
[52] U.S. Cl. ................................. 65/60.52; 65/60.8; 427/167; 427/255.1; 427/314
[58] Field of Search ................. 427/255.3, 314, 255.1, 427/248.1, 166, 167; 65/60.52, 60.8

[56] References Cited

U.S. PATENT DOCUMENTS

| | | | |
|---|---|---|---|
| 2,815,299 | 12/1957 | Raymond | 427/253 |
| 3,414,428 | 12/1968 | Kelly et al. | 427/253 |
| 3,535,103 | 10/1970 | Whitfield | 427/253 |
| 4,082,864 | 7/1978 | Kendall et al. | 427/253 |
| 4,212,663 | 7/1980 | Aslami | 118/724 |

Primary Examiner—Robert L. Lindsay
Attorney, Agent, or Firm—Marshall & Melhorn

[57] ABSTRACT

Vaporized reactants, useful for chemical vapor deposition of a coating on the surface of a hot substrate, are prepared by initially heating a liquid coating precursor, injecting the liquid coating precursor into a vaporization chamber, simultaneously admitting a blend gas into the vaporization chamber, heating the liquid and blend gas to cause the liquid to vaporize at a temperature below its standard vaporization temperature, and thoroughly mixing the coating precursor vapor and blend gas, to produce a stream of vaporized reactant for pyrolytic decomposition at the surface of the hot substrate. A horizontal thin film evaporator provides a particularly suitable vaporization chamber for the present process.

31 Claims, 1 Drawing Sheet

METHOD FOR PREPARING VAPORIZED REACTANTS FOR CHEMICAL VAPOR DEPOSITION

RELATED APPLICATIONS

This application is a continuation-in-part of U.S. application Ser. No 07/422,636, filed Oct. 17, 1989, and now abandoned.

FIELD OF THE INVENTION

The present invention relates to a method for preparing vaporized reactants, and more particularly, to a process for preparing mixtures of a vaporized reactant, e.g., a coating precursor, and a blend gas useful for chemical vapor deposition.

BACKGROUND OF THE INVENTION

Typically, coated glass articles are produced by continuously coating a glass substrate while it is being manufactured in a process known in the art as the "Float Glass Process". This process involves casting glass onto a molten tin bath which is suitably enclosed, then transferring the glass, after it has sufficiently cooled, to lift-out rolls which are aligned with the bath, and finally cooling the glass as it is advanced across the rolls initially through a lehr and thereafter while exposed to the ambient atmosphere. A non-oxidizing atmosphere is maintained in the float portion of the process, while the glass is in contact with the molten tin bath to prevent oxidation. An air atmosphere is maintained in the lehr. The chemical vapor deposition of various coatings may be conveniently performed in the bath or the lehr, or even in the transition zone therebetween.

The physical form of the reactants employed in glass coating processes is generally a gas, liquid, solid, vaporized liquid or solid, liquid or solid dispersed in a carrier gas mixture, or vaporized liquid or solid dispersed in a carrier gas mixture. The chemical vapor deposition process generally employs a vaporized liquid or solid, which is typically dispersed in a carrier gas mixture.

Chemical vapor deposition processes are well known in the art of coating glass substrates. U.S. Pat. No. 4,100,330 discloses a process for coating a glass substrate with a first layer of silicon and a second layer of a metal oxide deposited by the pyrolytic decomposition of a metal coating compound vapor at the surface of the hot substrate in an oxidizing atmosphere.

U.S. Pat. No. 4,847,157 discloses a process for coating a glass substrate with a first silicon-containing layer, a titanium nitride-containing layer overlaying the first layer, a second silicon-containing layer covering the titanium nitride-containing layer, and an optional abrasion resistant layer, e.g., comprising tin oxide, on the second silicon-containing layer.

U.S. Pat. No. 4,692,180 discloses a method for spraying a powdered metal compound directly onto the surface of a hot glass ribbon produced by the float glass process, wherein the powder pyrolytically decomposes to prepare a metal oxide coating U.S. Pat. No. 3,852,098 discloses the vaporization of dispersed powdered metal compounds by a hot carrier gas, which is then directed onto the surface of a hot glass substrate to deposit a metal oxide coating. A similar patent employing solid metal compounds is U.S. Pat. No. 2,780,553, wherein a fixed bed of metal coating compound is vaporized by contact with a hot carrier gas. Finally, U.S. Pat. No. 4,351,861 discloses a process for fluidizing a heated to vaporize the suspended particles, and directed onto the surface of a hot glass substrate to form a coating. These methods, employing solid coating precursor particles produce reactant streams which are subject to concentration variations due to fluctuations in particle sizes, changes in particle surface area over time, difficulties in conveying solid materials at a steady rate, etc.

The prior art also includes processes whereby organometallic salts are solubilized in acid or a hydrocarbon, and thereafter vaporized in a hot carrier gas. U.S. Pat. No. 4,571,350 discloses a process for spraying an atomized mist of a metal salt solution into a fuming chamber. The solution is vaporized and thereafter delivered to the surface of a hot glass substrate. U.S. Pat. No. 3,970,037 discloses dissolving a coating reactant into a solvent, which is then sprayed into a hot carrier gas where it is vaporized and then directed onto the surface of a hot glass substrate. In both cases, the reactant pyrolitically decomposes to produce an oxide coating, but the solubilizing agents interfere with the molecular transport at the surface of the glass, thereby causing variations in the deposition.

Yet another method for producing thermally decomposable metal vapor streams for chemical vapor deposition processes comprises bubbling a hot carrier gas through a metal salt in liquid form, such as is disclosed in U.S. Pat. Nos. 4,212,663 and 4,261,722. U.S. Pat. No. 3,808,035 discloses passing an inert gas sweep through a bubbler to produce a gas stream having a low precursor concentration, and thereafter directing the gas stream into contact with a substrate at a temperature of 100° C. to 300° C. Although the bubbling process provides a method for vaporizing liquid coating precursors directly into a carrier gas it suffers from several disadvantages which diminish its usefulness for preparing vaporized reactants for chemical vapor deposition. Primarily, the bath of liquid coating precursor must be maintained at a temperature near its vaporization temperature, during the entire vaporization process, in order to insure a high concentration of vaporized reactant in the carrier gas. This elevated bath temperature, maintained over an extended period of time, can accelerate decomposition of the coating precursors, some of which are very heat sensitive. In addition, the specific heat of vaporization required to vaporize the liquid causes the temperature of the bath to decrease as the carrier gas is bubbled through the compound. The decreasing bath temperature, which is difficult to remedy in a uniform manner using outside heat sources, causes the vapor pressure for the liquid to decrease, thereby causing a steadily decreasing concentration of vaporized precursor in the carrier gas stream. Finally, in a bubbling process where the liquid bath contains two or more coating precursors, each having a different pure component vapor pressure, the more volatile component will vaporize preferentially, thereby changing the partial vapor pressure of the liquid components, and consequently changing the concentrations of the vaporized reactants in the carrier gas stream as the liquid bath is depleted.

It must be noted that the prior art referred to hereinabove has been collected and examined only in light of the present invention as a guide. It is not to be inferred that such diverse art would otherwise be assembled absent the motivation provided by the present invention.

It would be desirable to be able to vaporize coating precursors or mixtures thereof such that a uniform, steady stream of concentrated coating precursor vapor is produced, which would allow the formation of thicker deposited layers than those obtainable by the prior art processes, while at the same time providing greater control for the deposition of the coating.

SUMMARY OF THE INVENTION

The present invention is directed toward a process for the preparation of vaporized reactants, useful, for example, for chemical vapor deposition onto hot substrates. In accordance with the present invention, it has surprisingly been discovered that vaporized reactants may be produced from coating precursors by a novel process which allows for the vaporization of higher, consistent concentrations of reactants in the gas stream comprising the steps of:

A) providing a coating precursor at a temperature above its melting point but substantially below its standard vaporization temperature, thereby causing the coating precursor to be in the form of a liquid;

B) simultaneously and continually performing the steps of:
  i) injecting the liquid coating precursor into a vaporization chamber, defined in part by at least one peripheral wall, wherein the liquid coating precursor produces a vapor;
  ii) admitting to the vaporization chamber a blend gas in an amount sufficient to increase the mass transport of the coating precursor vapor, and thus cause accelerated vaporization of the liquid coating precursor;
  iii) mixing the liquid coating precursor, coating precursor vapor and blend gas, including dispensing the liquid precursor as a thin film along said chamber wall;

whereby the liquid coating precursor is completely vaporized at a temperature below its standard vaporization temperature, to prepare a vaporized precursor gas stream having a high, uniform concentration of coating precursor; and C) conveying the mixture of coating precursor vapor and blend gas away from the vaporization chamber.

A horizontal thin film evaporator provides a suitable vaporization chamber for the process of the present invention. Preferably, the liquid coating precursor is injected at the upper inlet, and the blend gas is admitted at the lower inlet of the horizontal thin film evaporator. The blend gas is preferably preheated to about the temperature to which the vaporization chamber is heated. The vaporization chamber is preferably heated to a temperature greater than the temperature of the liquid precursor injected thereinto but below the coating precursor standard vaporization temperature.

The process of the present invention is conveniently conducted in a continuous fashion, and is suitable for vaporizing coating reactant precursors for use in chemical vapor deposition. It is particularly suitable for the chemical vapor deposition of coatings onto glass produced by the float glass process In this latter respect, the process includes the steps of:

A) providing a coating precursor at a temperature above its melting point but substantially below its standard vaporization temperature, thereby causing the coating precursor to be in the form of a liquid;

B) simultaneously and continually performing the steps of:
  i) injecting the liquid coating precursor into a vaporization chamber wherein the liquid coating precursor produces a vapor;
  ii) admitting to the vaporization chamber a blend gas in an amount sufficient to increase the mass transport of the coating precursor vapor and thus cause accelerated vaporization of the liquid coating precursor;
  iii) heating the liquid coating precursor, coating precursor vapor, and blend gas, to a temperature greater than the temperature of step A but below the coating precursor standard vaporization temperature; and
  iv) mixing the coating precursor, vapor and blend gas;

whereby the liquid coating precursor is completely vaporized at a temperature below its standard vaporization temperature, to prepare a vaporized reactant gas stream having a high, uniform concentration of coating precursor;

C) conveying the mixture of coating precursor vapor and blend gas away from the vaporization chamber; and D) contacting said mixture with a float glass ribbon substrate maintained at a temperature of at least 750° F.

BRIEF DESCRIPTION OF THE DRAWINGS

In the accompanying drawings, wherein like numerals are used to designate like parts throughout the same.

DETAILED DESCRIPTION OF THE PREFERRED EMBODIMENT

Figures 1, 2:
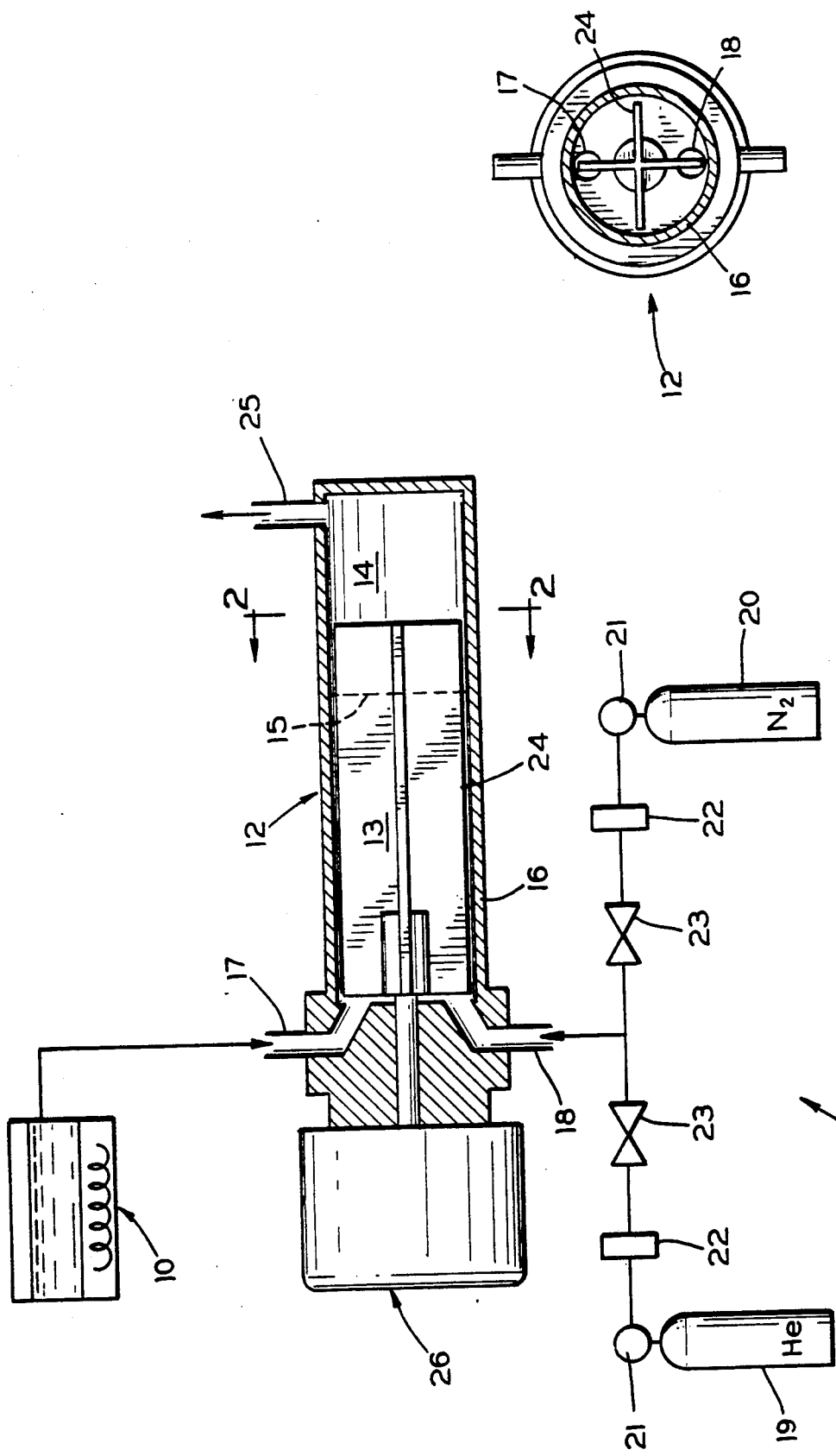
FIG. 1 is a somewhat schematic illustration of an apparatus for practicing the method of the invention, including a vertical cross-sectional view of a vaporization chamber, in this case a horizontal thin film evaporator.
FIG. 2 is a vertical cross-sectional view of the vaporization chamber taken along line 2—2 of FIG. 1.

Referring now more particularly to the drawings, apparatus for carrying out the invention includes a preheating vessel 10, equipment illustrated generally at 11 for the introduction of a blend gas into the system, and a vaporization chamber, generally designated by reference numeral 12. The vaporization chamber 12 contains a liquid zone 13 and a vapor zone 14 The boundary between the two zones is indicated generally by line 15 in FIG. 1. The liquid zone 13 is defined as the area within the vaporization chamber 12 in which the wall 16 of the vaporization chamber 12 is coated with liquid coating precursor, while the vapor zone 14 is defined as the area within the vaporization chamber 12 where the coating precursor has been completely converted to a vapor. The location of the boundary (indicated by line 15) between the liquid zone 13 and the vapor zone 14 will vary depending on the volatility of the particular coating precursor being used, the vapor chamber shell temperature, mass flow rate of blend gas, etc. Thus, when using a coating precursor having a relatively high volatility, the vaporization chamber will have a relatively large vapor zone 14.

Liquid coating precursor is injected into the liquid zone 13 of the vaporization chamber 12 through an upper inlet 17, so called because it is situated adjacent the top of the vaporization chamber 12. A blend gas is injected into the liquid zone 13 of vaporization chamber 12 through a lower inlet 18, so called because it is situated adjacent the bottom of the vaporization chamber 12. The blend gas, which for example may comprise helium or nitrogen or mixtures thereof, is stored in cylinders 19 and 20 and piped through regulators 21, flow meters 22, and valves 23 into the inlet 18. Because the blend gas is injected from below and the coating precursor is injected from above, intimate contact occurs between the falling liquid and rising blend gas.

As shown in FIGS. 1 and 2, a set of mixing blades 24 rotate inside the vaporization chamber 12 and distribute the liquid precursor as a uniform, thin film upon the vaporization chamber wall(s), and provides further mixing of the coating precursor and the blend gas. Once the coating precursor has been converted to a vapor, it is discharged, along with the blend gas, from the vapor zone 14 through the outlet 25. The vapor may then be further treated for example continued with other vapor reactants or dopants, and/or transported to an area suitable for CVD deposition.

Coatings may be deposited onto the surface of a hot glass substrate by a process generally known in the art as chemical vapor deposition (CVD). This process is typically conducted during the manufacture of glass by the float glass process, and may occur in the float metal bath where the glass ribbon is typically at a temperature in the range of about 1100° F. to about 1250° F., the lehr (glass temperatures of about 750° F. to about 1050° F.), or in the transition zone between the bath and the lehr (glass temperatures of about 1025° F. to about 1100° F.). Coating precursors are vaporized and conveyed to a point at or near the surface of the advancing glass ribbon In the presence of oxygen, the coating precursors pyrolytically decompose to form an oxide coating on the surface of the glass. However, the invention is not limited to the deposition of oxide coatings, but can also be used when depositing non-oxide coatings such as silicon or titanium nitride. In addition, the invention can be used for chemical vapor deposition on any substrate, and is not limited to deposition on glass.

Suitable coating precursors useful for practicing the present invention include, without limitation to those specifically recited, dimethyltin dichloride, tetraethoxysilane, diethyltin dichloride, dibutyltin diacetate, tetramethyl tin, methyltin trichloride, triethyltin chloride, trimethyltin chloride, tetrabutyl titanate, titanium tetrachloride, titanium tetraisopropoxide, triethylaluminum, diethylaluminum chloride, trimethylaluminum, aluminum acetylacetonate, aluminum ethylate, diethyldichlorosilane, methyltriethoxysilane, zinc acetylacetonate, zinc propionate, or mixtures thereof. These compounds are generally well known in the art of CVD technology, as precursors for applying coatings on hot glass. The invention will work equally well for any precursor material, or mixtures thereof, that exert a vapor pressure. A preferred coating precursor for depositing tin oxide is dimethyltin dichloride, or a mixture of dimethyltin dichloride and methyltin trichloride, for example 95 weight percent dimethyltin dichloride and 5 weight percent methyltin trichloride.

The coating precursors of the present invention are either liquids, which exert a vapor pressure at room temperature, or solids which, when heated above room temperature but below their standard vaporization temperatures, become liquids which exert a vapor pressure at those elevated temperatures. By "standard vaporization temperature" as used herein is meant the temperature at which the vapor pressure of the pure component liquid is equal to one atmosphere. In either case, the coating precursors in the present invention are initially heated in a preheating vessel 10 to temperatures above their melting points but substantially below their standard vaporization temperatures. At such temperatures the coating precursors become volatile liquids which are well below their decomposition temperatures. By the term "substantially below the standard vaporization temperature" as used herein is meant a temperature which is from 10 to 90 degrees Fahrenheit below a compound's (the coating precursor) standard vaporization temperature, such that thermal decomposition of the heat sensitive compounds is greatly reduced.

Addition of a blend gas to the vapor chamber increases the mass transfer of coating precursor vapors from the vapor chamber. This increase in mass transfer of coating precursor vapor causes accelerated vaporization of the liquid coating precursor. The contacting of the liquid coating precursor and blend gas desirably occurs within a vaporization chamber. By "vaporization chamber" as used herein is meant an enclosed vessel, containing a liquid zone and a vapor zone, wherein as liquid is injected into the vessel it is propelled against the inner wall of the vessel to form a uniform thin film thereon, and subsequently vaporizes. The force which propels the liquid against the wall may be imparted for example by mechanical rotors, pressure driven liquid flow or centrifugal forces from rotating blades inside the vaporizer or rotating vaporizer shell (with or without blades), etc. The walls of the vessel may optionally be heated to increase the rate of vaporization of the liquid as it contacts the walls of the vaporization chamber. Contemplated blend gases include for example helium, nitrogen, hydrogen, argon, or any other carrier gas which is chemically inert with the coating precursor at the temperatures involved, as well as mixtures thereof. Preferred blend gasses are helium and nitrogen, and mixtures thereof.

The coating precursor may be initially heated by any conventional apparatus known in the art for heating solids or liquids, such as fired or electrical resistance heating of a preheating vessel 10 containing the coating precursor. The coating precursor is typically heated to a temperature above its melting point but substantially below its standard vaporization temperature, and thereafter injected as a liquid into the vaporization chamber.

Within the vaporization chamber 12, the liquid coating precursor is completely vaporized. Rotating mixing blades 24 are utilized to mix the contents of the vaporization chamber 12. Due to the centrifugal forces generated by the mixing blades 24, the liquid coating precursor is continually distributed in a thin, uniform film on the wall of the vaporization chamber 12. Turbulence is imparted to the film as it flows toward the outlet 25, inducing a high rate of heat transfer into the liquid film coincident with vapor formation. In addition, the liquid coating precursor, coating precursor vapor, and blend gas are heated inside the vaporization chamber 12 to a temperature greater than the temperature of the injected liquid coating precursor, but still below the coating precursor standard vaporization temperature. The temperature to which the components are heated will be determined by the thermal decomposition characteristics of the particular coating precursor used and the mass flow rate of the chosen blend gas. The liquid coating precursor and chemical composition of the blend gas, as well as their respective rates of introduction into the vaporization chamber 12, must be selected concertedly, such that a sufficient amount of blend gas is present to cause an increase in the mass transfer of the vaporized coating precursor, thereby accelerating the vaporization of the liquid. In this manner, the liquid coating precursor is completely vaporized at a temperature below its standard vaporization temperature.

Because the liquid coating precursor is quickly vaporized in relatively small quantities, the bulk of the liquid encounters elevated temperatures only for a short period of time. This is in contrast to the conventional bubbling process which required the entire bath to be maintained near the vaporization temperature, often times causing decomposition of the liquid coating precursor. Since, in the present invention, the bulk of the liquid is maintained at temperatures lower than that of processes previously disclosed in the prior art, decomposition of the liquid coating precursor is minimized.

The liquid coating precursor, coating precursor vapor, and blend gas are conveniently heated by heating the vaporization chamber 12 using conventional means, such as for example fired or electrical resistance heating or steam jacketing. In this way, the temperature of the vaporization chamber 12 is constantly maintained, and the heat necessary for vaporization of the liquid is provided. The coating precursor may be preheated inside preheating vessel 10 to a temperature above its melting point, but substantially below its vaporization point. The blend gas is preferably preheated to approximately the temperature of the vaporization chamber before its introduction into the vaporization chamber.

Means are provided in the vaporization chamber 12 to assure complete mixing of the precursor and blend gas, so that, ultimately, a uniform reactant mixture is directed against the substrate.

The present invention provides an improved method for vaporizing coating compounds resulting in a uniform, high concentration of the vaporized coating precursor and blend gas. This is advantageous for accurately controlling the thickness of the applied coating, reducing the amount of coating precursor decomposition prior to coating, and producing thicker coatings than are obtainable by conventional vaporization processes.

A horizontal thin film evaporator, such as for example is commercially available from Artisan Industries, Inc., Waltham, Mass., having the product designation "One-Half Square Foot Rototherm E", provides a suitable vaporization chamber 12 for the present process. Desirably, the liquid coating precursor is injected into the vaporization chamber 12 through the upper inlet 17, and the blend gas is injected into the vaporization chamber 12 through the lower inlet 18, which is located at the same end of the vaporization chamber 12 as the upper inlet 17. Additionally, the rotation of a set of blades 24 inside the vaporization chamber 12 (in this case, a horizontal thin film evaporator) provides thorough mixing of the coating precursor and blend gas. A motor 26 supplies the power to rotate the blades 24. The vapor mixture is conveniently discharged at an outlet 25, which is located at the end opposite the end which includes the upper and lower inlets 17 and 18.

The process of the present invention is conducted in a continuous fashion, such that a stream of the gas mixture is continually produced having a uniform, high concentration of coating precursor vapor. The stream is caused to flow from the vaporization chamber 12 through a conduit to the surface of the hot substrate by means of pressure generated by the vaporization of the liquid injected through the upper inlet 17 and by the introduction of the pressurized blend gas through the lower inlet 18 into the vaporization chamber 12.

When utilizing the coating precursors and blend gasses mentioned herein in accordance with the invention, the blend gas is generally admitted through lower inlet 18 into the vaporization chamber 12 at a pressure from about 2 to about 15 psig, and a flow rate from about 100 to about 400 standard liters per minute. The liquid coating precursor is first preheated to a temperature of from about 70° F. to about 530° F. then injected into the vaporization chamber through the upper inlet 17, and the contents of the vaporization chamber 12 are maintained at a temperature from about 95° F. to about 555° F. The liquid coating precursor is desirably vaporized at a rate from about 0.5 to about 120 pounds per hour. The mass flow rates stated hereinabove for the blend gas and liquid coating precursor are suggested rates when employing for example a one-half square foot surface area horizontal thin film evaporator as the vaporization chamber 12. It must be understood, however, that virtually any flow rate of blend gas and liquid coating precursor may be used, given a suitable vaporization chamber and the proper reaction conditions. For example, larger models of the Rototherm E will vaporize greater quantities of liquid coating precursor. The rates will be determined by the desired thickness and growth rate for the coating.

For example, a vapor reactant mixture, suitable for chemical vapor deposition of a tin oxide coating, may be generated using dimethyltin dichloride as the precursor. The nitrogen blend gas is generally admitted through lower inlet 18 into the vaporization chamber 12 at a pressure from about 2 to about 15 psig, and a flow rate from about 100 to about 400 standard liters per minute. Dimethyltin dichloride is first preheated to a temperature of about 225° F. to about 375° F., then injected, e.g., by pressure driven liquid flow or pump, into the vaporization chamber, and the contents of the vaporization chamber 12 are maintained at a temperature from about 250° F. to about 400° F. The dimethyltin dichloride liquid coating precursor is desirably vaporized at a rate from about 1 to about 64 pounds per hour or 0.77 to 49 standard liters per minute. Dimethyltin dichloride flow rates such as these, together with a blend gas flow rate of 400 standard liters per minute, will result in a vapor reactant stream at the outlet 25 of from 0.19 percent to 12.3 percent gas phase (volume/volume) dimethyltin dichloride. With smaller or larger blend gas flows, the percent gas phase will increase or decrease, respectively. The mass flow rates stated hereinabove for the blend gas and liquid coating precursor are suggested rates when employing for example a one-half square foot surface area horizontal thin film evaporator as the vaporization chamber 12. Tin oxide coatings can be deposited on glass at a growth rate of up to about 2,200 Angstroms per second using mixtures of dimethyltin dichloride within the range of rates listed immediately hereinabove.

Most coating precursors, when vaporized, are extremely flammable under oxidizing conditions, and therefore can only be conveyed to the reaction site in a carrier gas stream at a concentration of a few gas phase percent. Higher concentrations of coating precursor vapor will ignite when contacted with the surface of the hot substrate in an oxidizing atmosphere. Therefore, the coating operation must be conducted utilizing a vaporized coating precursor stream having a concentration below the flammability limit for that particular coating precursor.

Due to the inherent variability of the vaporization processes of the prior art, e.g., vaporization of dispersed or fluidized powders, vaporization of particles in a packed bed, vaporization of solubilized compounds, or bubbling of a carrier gas through a liquid metal salt, the concentration of the coating precursor vapor in the carrier gas generated by such processes commonly fluctuated or changed over time. Therefore, the average usable concentration of the coating precursor vapor had to be substantially below the flammability limit, so that surges in concentration would not trigger ignition of the coating precursor vapor.

Conversely, the process of the present invention provides a steady stream of a coating precursor vapor having uniform concentration. Because there is less deviation in the concentration of the vapor stream, the vapor may be transported at temperatures closer to the flammability limit. Consequently, more coating precursor may be vaporized and conveyed to the reaction zone, thereby providing thicker coatings and higher growth rates than are obtainable through the vaporization processes heretofore known in the art.

It must be noted that the process conditions are not sharply critical for the successful preparation of vaporized reactants according to the present invention. The process conditions described hereinabove are generally disclosed in terms which are conventional to the practice of this invention. Occasionally, however, the process conditions as described may not be precisely applicable for each compound included within the disclosed scope. Those compounds for which this occurs will be readily recognizable by those ordinarily skilled in the art. In such cases, the process may be successfully performed by conventional modifications known to those ordinarily skilled in the art, e.g., increasing or decreasing temperature conditions, varying the rates of introduction of the coating precursor or blend gas, changing to alternative CVD reactants or blend gases, routine modifications of the vaporization process conditions, etc.

The invention is more easily comprehended by reference to a specific embodiment which is representative of the invention. It must be understood, however, that the specific embodiment is provided only for the purpose of illustration, and that the invention may be practiced otherwise than as specifically illustrated without departing from its spirit and scope. For example, apparatus other than a horizontal thin film evaporator, but which provides for the intimate contacting, rapid heating, and thorough mixing of the metal coating compound and blend gas, may be used as a vaporization chamber.

EXAMPLE

Dimethyltin dichloride is heated to about 280° F. and injected as a liquid at about 64 pounds per hour into the upper inlet 17 of a vaporization chamber 12, in this case a one-half square foot surface area horizontal thin film evaporator. Simultaneously, 250 standard liters per minute (slm) of nitrogen at a pressure of about 7 psig is admitted to the lower inlet 18 of the vaporization chamber 12, and the contents of the vaporization chamber 12 heated to maintain a temperature of about 320° F. The reactant stream, containing about 50 slm of vaporized dimethyltin dichloride and about 250 slm of nitrogen (16.5% gas phase dimethyltin dichloride), is conveyed away from the vaporization chamber 12, from the outlet 25 at the end of the vaporization chamber 12 opposite the end which includes the inlets 17 and 18. The reactant stream is thereafter heated and combined with about 50 slm of oxygen and about 23 slm of water vapor, at which point the mixture comprises about 13% gas phase dimethyltin dichloride. The combined reactant stream is directed onto the surface of a hot glass substrate as it is being manufactured by the float glass process and at a temperature of about 1160° F., resulting in a uniform tin oxide coating deposited at a rate of about 2,200 Angstroms per second.

The parameters disclosed hereinabove for dimethyltin dichloride work equally well for a precursor mixture comprising 95 weight percent dimethyltin dichloride and 5 weight percent methyltin trichloride.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A process for preparing vaporized reactants, comprising the steps of:
   A) providing a coating precursor selected from metal or silicon compounds at a temperature above its melting point but substantially below its standard vaporization temperature, thereby causing the coating precursor to be in the form of a liquid;
   B) simultaneously and continually performing the steps of:
      i) injecting the liquid coating precursor into a vaporization chamber, defined in part by at least one peripheral wall, wherein the liquid coating precursor produces a vapor;
      ii) admitting to the vaporization chamber a blend gas in an amount sufficient to increase the mass transport of the coating precursor vapor and thus cause accelerated vaporization of the liquid coating precursor;
      iii) mixing the liquid coating precursor, coating precursor vapor and blend gas, including dispensing the liquid precursor as a thin film along said chamber wall;
   whereby the liquid coating precursor is completely vaporized at a temperature below its standard vaporization temperature, to prepare a vaporized reactant gas stream having a high, uniform concentration of coating precursor; and
   C) conveying the reactant gas stream away from the vaporization chamber and into contact with a substrate.

2. The process for preparing vaporized reactants, according to claim 1, wherein the coating precursor is preheated before being injected into the vaporization chamber, but to a temperature less than its standard vaporization temperature.

3. The process for preparing vaporized reactants, according to claim 1, wherein said at least one wall of the vaporization chamber is heated.

4. The process for preparing vaporized reactants, according to claim 2, wherein said at least one wall of the vaporization chamber is heated to a temperature greater than said preheat temperature but below the standard vaporization temperature of the liquid coating precursor.

5. The process for preparing vaporized reactants, according to claim 1, wherein the blend gas is preheated to about the temperature of the vaporization chamber prior to being injected thereinto.

6. The process for preparing vaporized reactants, according to claim 1, wherein the vaporization chamber comprises a horizontal thin film evaporator.

7. The process for preparing vaporized reactants, according to claim 6, wherein the thin film evaporator includes an upper inlet at an end of the horizontal thin film evaporator and a lower inlet at the same end of the evaporator as the upper inlet, and further wherein the liquid coating precursor is injected into the evaporator through the upper inlet, and the blend gas is admitted to the evaporator through the lower inlet.

8. A process for preparing vaporized reactants, comprising the steps of:
A) providing a coating precursor selected from metal or temperature above its melting point but substantially below its standard vaporization temperature, thereby causing the coating precursor to be in the form of a liquid;
B) simultaneously and continually performing the steps of:
i) injecting the liquid coating precursor into a vaporization chamber, wherein the liquid coating precursor produces a vapor;
ii) admitting to the vaporization chamber a blend gas in an amount sufficient to increase the mass transport of the coating precursor vapor and thus cause accelerated vaporization of the liquid coating precursor;
iii) heating the liquid coating precursor, coating precursor vapor, and blend gas, to a temperature greater than the temperature of step A but below the coating precursor's standard vaporization temperature; and
iv) mixing the coating precursor, vapor and blend gas;
whereby the liquid coating precursor is completely vaporized at a temperature below its standard vaporization temperature, to prepare a vaporized reactant gas stream having a high, uniform concentration of coating precursor in a blend gas;
C) conveying the reactant gas stream away from the vaporization chamber; and
D) contacting said reactant gas stream with a float glass ribbon substrate maintained at a temperature of at least 750° F.

9. The process for preparing vaporized reactants, according to claim 8, wherein said contact of said reactant gas stream and substrate takes place in the presence of oxygen.

10. The process for preparing vaporized reactants according to claim 8, wherein said contact of said reactant gas stream with said substrate takes place while said ribbon is supported on a bath of molten metal and is at a temperature in the range of about 1100° F. to about 1250° F.

11. The process for preparing vaporized reactants, according to claim 8, wherein the coating precursor is selected from the group consisting of dimethyltin dichloride, tetraethoxysilane, diethyltin dichloride, dibutyltin diacetate, tetramethyl tin, methyltin trichloride, triethyltin chloride, trimethyltin chloride, tetrabutyl titanate, titanium tetrachloride, titanium tetraisopropoxide, triethylaluminum, diethylaluminum chloride, trimethylaluminum, aluminum acetylacetonate, aluminum ethylate, diethyldichlorosilane, methyltriethoxysilane, zinc acetylacetonate, zinc propionate, and mixtures thereof.

12. The process for preparing vaporized reactants, according to claim 11, wherein the coating precursor is dimethyltin dichloride.

13. The process for preparing vaporized reactants, according to claim 11, wherein the coating precursor is 95 percent by weight dimethyltin dichloride and 5 percent by weight methyltin trichloride.

14. The process for preparing vaporized reactants, according to claim 11, wherein the blend gas is selected from the group consisting of helium, nitrogen, hydrogen, argon, and mixtures thereof.

15. The process for preparing vaporized reactants, according to claim 11, wherein the liquid coating precursor is injected into the vaporization chamber at a temperature of from about 70° F. to about 530° F.

16. The process for preparing vaporized reactants, according to claim 11, wherein the liquid coating precursor, coating precursor vapor, and blend gas are heated in the vaporization chamber to a temperature from about 95° F. to about 555° F.

17. The process for preparing vaporized reactants, according to claim 11, wherein the liquid coating precursor is injected into the vaporization chamber at a rate from about 0.5 to about 120 pounds per hour.

18. The process for preparing vaporized reactants, according to claim 11, wherein the blend gas is admitted to the vaporization chamber at a pressure from about 2 to about 15 psig.

19. The process for preparing vaporized reactants, according to claim 11, wherein the blend gas is admitted to the vaporization chamber at a rate from about 100 to about 400 standard liters per minute.

20. A process for preparing vaporized reactants, comprising the steps of:
A) providing a coating precursor selected from the group consisting of dimethyltin dichloride, tetraethoxysilane, diethyltin dichloride, dibutyltin diacetate, tetramethyl tin, methyltin trichoride, triethyltin chloride, trimethyltin chloride, tetrabutyl titanate, titanium tetrachloride, titanium tetraisopropoxide, triethylaluminum, diethylaluminum chloride, trimethylaluminum, aluminum acetylacetonate, aluminum ethylate, diethyldichlorosilane, methyltriethoxysilane, zinc acetylacetonate, zinc propionate and mixtures thereof, at a temperature above its melting point but substantially below its standard vaporization temperature and in the range from about 70° F. to about 530° F., thereby causing the coating precursor to be in the form of a liquid;
B) simultaneously and continually performing the steps of:
i) injecting the liquid coating precursor, at a rate from about 0.5 to about 120 pounds per hour, into a vaporization chamber defined in part by at least one peripheral wall, wherein the liquid coating precursor produces a vapor;
ii) admitting to the vaporization chamber a blend gas selected from the group consisting of helium, nitrogen, hydrogen, argon and mixtures thereof in an amount in the range from about 25 to about 500 standard liters per minute and at a pressure from about 2 to about 15 psig;
iii) heating the liquid coating precursor, coating precursor vapor, and blend gas, to a temperature greater than the temperature of step A but below the coating precursor's standard vaporization temperature and in the range from about 95° F. to about 555° F.; and iv) mixing the liquid coating precursor, coating precursor vapor and blend gas including dispensing the liquid precursor as a thin film along said chamber wall;

whereby the liquid coating precursor is completely vaporized at a temperature below its standard vaporization temperature, to prepare a vaporized reactant gas stream having a high, uniform concentration of coating precursor;

C) conveying the reactant gas stream away from the vaporization chamber; and

D) contacting said reactant gas stream with a float glass ribbon substrate maintained at a temperature of at least 750° F.

21. A process for preparing vaporized, reactants, comprising the steps of:
A) providing a metal coating precursor, selected from the group consisting of dimethyltin dichloride, tetraethoxysilane, diethyltin dichloride, dibutyltin diacetate, tetramethyl tin, methyltin trichloride, triethyltin chloride, trimethyltin chloride, tetrabutyl titanate, titanium tetrachloride, titanium tetraisopropoxide, triethylaluminum, diethylaluminum chloride, trimethylaluminum, aluminum acetylacetonate, aluminum ethylate, zinc acetylacetonate, zinc propionate and mixtures thereof, at a temperature above its melting point but substantially below its standard vaporization temperature and in the range from about 70° F. to about 530° F., thereby causing the metal coating precursor to be in the form of a liquid;
B) simultaneously and continually performing the steps of:
i) injecting the liquid metal coating precursor, at a rate from about 0.5 to about 120 pounds per hour, into a vaporization chamber defined in part by at least one peripheral wall, wherein the liquid metal coating precursor produces a vapor;
ii) admitting to the vaporization chamber a blend gas selected from the group consisting of helium, nitrogen, hydrogen, argon and mixtures thereof in an amount in the range from about 25 to about 500 standard liters per minute and at a pressure from about 2 to about 15 psig in an amount to thus cause accelerated vaporization of the liquid metal coating precursor;
iii) heating the liquid metal coating precursor, metal coating precursor vapor, and blend gas, to a temperature greater than the temperature of step A but below the metal coating precursor's standard vaporization temperature and in the range from about 95° F. to about 555° F.; and
iv) mixing the liquid metal coating precursor, metal coating precursor vapor and blend gas including dispensing the liquid metal coating precursor as a thin film along said chamber wall;
whereby the liquid metal coating precursor is completely vaporized at a temperature below its standard vaporization temperature, to prepare a vaporized reactant gas stream having a high, uniform concentration of metal coating precursor in a blend gas;
C) conveying the reactant gas stream away from the vaporization chamber; and
D) contacting said reactant gas stream with a float glass ribbon substrate maintained at a temperature of at least 750° F.

22. The process for preparing vaporized reactants, according to claim 21, wherein the vaporization chamber comprises a horizontal thin film evaporator.

23. The process for preparing vaporized reactants, according to claim 22, wherein the thin film evaporator includes an upper inlet at an end of the horizontal thin film evaporator and a lower inlet at the same end of the evaporator as the upper inlet, and further wherein the liquid coating precursor is injected into the evaporator through the upper inlet, and the blend gas is admitted to the evaporator through the lower inlet.

24. The process for preparing vaporized reactants, according to claim 23, wherein the blend gas is selected from the group consisting of helium, nitrogen and mixtures thereof.

25. A process for preparing vaporized reactants, comprising the steps of:
A) providing dimethyltin dichloride at a temperature in the range of about 225° F. to about 375° F., thereby causing the dimethyltin dichloride to be in the form of a liquid;
B) simultaneously and continually performing the steps of:
i) injecting the liquid dimethyltin dichloride, at a rate of about 1 to about 75 pounds per hour, into a horizontal thin film evaporator defined in part by at least one peripheral wall, wherein the liquid dimethyltin dichloride produces a vapor;
ii) admitting to the horizontal thin film evaporator a blend gas selected from the group consisting of helium, nitrogen and mixtures thereof, in an amount in the range from about 25 to about 500 standard liters per minute and at a pressure from about 2 to about 15 psig to thus cause accelerated vaporization of the liquid dimethyltin dichloride;
iii) heating the liquid dimethyltin dichloride, dimethyltin dichloride vapor and blend gas to a temperature greater than the temperature of step A but below the standard vaporization temperature of dimethyltin dichloride and in the range of from about 250° F. to about 400° F.; and
iv) mixing the liquid dimethyltin dichloride, dimethyltin dichloride vapor and blend gas, including dispensing the liquid dimethyltin dichloride as a thin film along said evaporator wall;
whereby the liquid dimethyltin dichloride is completely vaporized at a temperature below its standard vaporization temperature, to prepare a vaporized reactant gas stream having a high, uniform concentration of dimethyltin dichloride in a blend gas; and
C) conveying the reactant gas stream away from the horizontal thin film evaporator and into contact with a substrate.

26. A process for depositing coatings on glass comprising:
A) forming a vaporized reactant gas stream including the mixture of dimethyltin dichloride vapor and blend gas produced in accordance with claim 25; and
B) contacting said reactant gas stream with a float glass ribbon substrate maintained at a temperature of at least 750° F.

27. A process for depositing coatings on glass, according to claim 26, wherein said contact of said reactant gas stream and glass ribbon takes place in the presence of oxygen, and while said ribbon is supported on a bath of molten metal and is at a temperature in the range of about 1100° F. to about 1250° F.

28. A process for preparing vaporized reactants, comprising the steps of:
A) providing a mixture of 95 weight percent dimethyltin dichloride and 5 weight percent methyltin trichloride at a temperature in the range of about 225° F. to about 375° F., thereby causing the mixture to be in the form of a liquid;
B) simultaneously and continually performing the steps of:
i) injecting the liquid dimethyltin dichloride-methyltin trichloride mixture, at a rate of about 1 to about 75 pounds per hour, into a horizontal thin film evaporator defined in part by at least one peripheral wall, wherein the liquid mixture produces a vapor;
ii) admitting to the horizontal thin film evaporator a blend gas selected from the group consisting of helium, nitrogen and mixtures thereof, in an amount in the range from about 25 to about 500 standard liters per minute and at a pressure from about 2 to about 15 psig to thus cause accelerated vaporization of the liquid mixture;
iii) heating the liquid dimethyltin dichloride-methyltin trichloride mixture, the vaporized dimethyltin dichloride-methyltin trichloride mixture, and blend gas to a temperature greater than the temperature of step A and in the range of from about 250° F. to about 400° F.;
iv) mixing the liquid dimethyltin dichloride-methyltin trichloride mixture, the vaporized dimethyltin dichloride-methyltin trichloride, and blend gas including dispensing the liquid dimethyltin dichloride-methyltin trichloride as a thin film along said evaporator wall;
whereby the liquid dimethyltin dichloride-methyltin trichloride mixture is completely vaporized, to prepare a vaporized reactant gas stream having a high, uniform concentration comprised of 95 weight percent dimethyltin dichloride and 5 weight percent methyltin trichloride;
C) conveying the vaporized reactant gas stream away from the horizontal thin film evaporator and into contact with a substrate.

29. A process for depositing tin oxide coatings on glass comprising:
A) forming a vaporized reactant gas stream including the dimethyltin dichloride-methyltin trichloride and blend gas mixture produced in accordance with claim 28; and
B) contacting said reacting gas stream with a float glass substrate, in the presence of oxygen, while said ribbon is supported on a bath of molten metal and at a temperature in the range of about 1100° F. to about 1250° F.

30. The process for preparing vaporized reactants, according to claim 27, wherein the vaporized reactant gas stream is utilized to form a coating on hot glass at a growth rate up to about 2,200 Angstroms per second.

31. The process for depositing tin oxide coatings on glass, according to claim 29, wherein the vaporized reactant gas stream is utilized to form a tin oxide coating on the glass ribbon at a growth rate up to about 2,200 Angstroms per second.

* * * * *